(12) United States Patent
Dolechek et al.

(10) Patent No.: US 7,625,821 B2
(45) Date of Patent: *Dec. 1, 2009

(54) PROCESS AND APPARATUS FOR THINNING A SEMICONDUCTOR WORKPIECE

(75) Inventors: Kert L. Dolechek, Kalispell, MT (US); Raymon F. Thompson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 368 days.

This patent is subject to a terminal disclaimer.

(21) Appl. No.: 11/420,591

(22) Filed: May 26, 2006

(65) Prior Publication Data

US 2006/0203419 A1 Sep. 14, 2006

Related U.S. Application Data

(62) Division of application No. 10/923,131, filed on Aug. 20, 2004, now Pat. No. 7,193,295.

(51) Int. Cl.
*H01L 21/302* (2006.01)

(52) U.S. Cl. .............................. 438/690; 257/E21.214; 257/E21.23; 257/E21.237; 257/E21.304; 438/691; 438/692; 438/959

(58) Field of Classification Search .......... 257/E21.214, 257/E21.23, E21.237, E21.304; 438/690–692, 438/959

See application file for complete search history.

(56) References Cited

U.S. PATENT DOCUMENTS

| | | | |
|---|---|---|---|
| 4,116,714 A * | 9/1978 | Basi | ............................... 134/3 |
| 4,903,717 A | 2/1990 | Sumnitsch | |
| 4,946,716 A | 8/1990 | Corrie | |
| 5,127,984 A | 7/1992 | Hua et al. | |
| 5,232,511 A | 8/1993 | Bergman | |
| 5,234,540 A | 8/1993 | Grant et al. | |
| 5,235,995 A | 8/1993 | Bergman et al. | |
| 5,248,380 A | 9/1993 | Tanaka | |
| 5,256,599 A | 10/1993 | Asetta et al. | |
| 5,268,065 A | 12/1993 | Grupen-Shemansky | |
| 5,275,958 A | 1/1994 | Ishikawa | |
| 5,277,769 A | 1/1994 | Medernach | |
| 5,279,703 A | 1/1994 | Haberger et al. | |
| 5,423,944 A | 6/1995 | Wong | |
| 5,476,566 A | 12/1995 | Cavasin | |
| 5,513,668 A | 5/1996 | Sumnitsch | |
| 5,762,391 A | 6/1998 | Sumnitsch | |
| 5,896,875 A | 4/1999 | Yoneda | |
| 5,896,877 A | 4/1999 | Pirker | |
| 5,904,164 A | 5/1999 | Wagner et al. | |
| 5,922,624 A | 7/1999 | Verhaverbeke et al. | |
| 5,927,993 A | 7/1999 | Lesk et al. | |
| 5,931,518 A | 8/1999 | Pirker | |
| 5,948,699 A | 9/1999 | Lawrence et al. | |
| 5,967,578 A | 10/1999 | Frey | |

(Continued)

FOREIGN PATENT DOCUMENTS

EP 0548596 6/1993

(Continued)

*Primary Examiner*—Asok K Sarkar
(74) *Attorney, Agent, or Firm*—McDermott Will & Emery; Jeffrey R. Gargano; Craig E. Bohn

(57) ABSTRACT

The present invention provides system and apparatus for use in processing wafers. The new system and apparatus allows for the production of thinner wafers that at same time remain strong. As a result, the wafers produced by the present process are less susceptible to breaking. The unique system also offers an improved structure for handling thinned wafers and reduces the number of processing steps. This results in improved yields and improved process efficiency.

39 Claims, 11 Drawing Sheets

U.S. PATENT DOCUMENTS

| | | | |
|---|---|---|---|
| 6,046,073 | A | 4/2000 | Lang et al. |
| 6,056,208 | A | 5/2000 | Pirker et al. |
| 6,056,825 | A | 5/2000 | Sumnitsch |
| 6,109,677 | A | 8/2000 | Anthony |
| 6,149,759 | A | 11/2000 | Guggenberger |
| 6,152,507 | A | 11/2000 | Pirker |
| 6,153,536 | A | 11/2000 | Brouillette et al. |
| 6,162,703 | A | 12/2000 | Muntifering et al. |
| 6,162,739 | A | 12/2000 | Sumnitsch et al. |
| 6,169,038 | B1 | 1/2001 | Kruwinus et al. |
| 6,193,798 | B1 | 2/2001 | Sumnitsch |
| 6,248,222 | B1 * | 6/2001 | Wang .................... 204/297.09 |
| 6,316,367 | B1 | 11/2001 | Sumnitsch |
| 6,322,903 | B1 | 11/2001 | Siniaguine et al. |
| 6,328,846 | B1 | 12/2001 | Langen et al. |
| 6,342,434 | B1 | 1/2002 | Miyamoto et al. |
| 6,350,664 | B1 | 2/2002 | Haji et al. |
| 6,383,331 | B1 | 5/2002 | Sumnitsch |
| 6,385,863 | B1 | 5/2002 | Kruwinus |
| 6,402,843 | B1 | 6/2002 | Siniaguine et al. |
| 6,420,209 | B1 | 7/2002 | Siniaguine |
| 6,435,200 | B1 | 8/2002 | Langen |
| 6,448,153 | B2 | 9/2002 | Siniaguine et al. |
| 6,492,195 | B2 | 12/2002 | Nakanishi et al. |
| 6,494,221 | B1 | 12/2002 | Sellmer et al. |
| 6,497,765 | B1 | 12/2002 | Nice |
| 6,497,768 | B2 | 12/2002 | Bergman |
| 6,498,074 | B2 | 12/2002 | Siniaguine et al. |
| 6,500,764 | B1 | 12/2002 | Pritchett |
| 6,506,681 | B2 | 1/2003 | Grigg et al. |
| 6,524,881 | B1 | 2/2003 | Tandy et al. |
| 6,536,454 | B2 | 3/2003 | Lindner |
| 6,551,905 | B1 | 4/2003 | Barsky et al. |
| 6,573,158 | B1 | 6/2003 | Miyamoto et al. |
| 6,608,370 | B1 | 8/2003 | Chen et al. |
| 6,627,548 | B1 | 9/2003 | Kruwinus et al. |
| 6,699,356 | B2 | 3/2004 | Bachrach et al. |
| 6,713,366 | B2 | 3/2004 | Mong et al. |
| 6,717,254 | B2 | 4/2004 | Siniaguine |
| 6,730,595 | B2 | 5/2004 | Saimoto et al. |
| 6,803,294 | B2 | 10/2004 | Kouno et al. |
| 6,940,181 | B2 * | 9/2005 | Derderian et al. ........... 257/787 |
| 2002/0048907 | A1 | 4/2002 | Miyamoto et al. |
| 2002/0061642 | A1 | 5/2002 | Haji et al. |
| 2003/0038115 | A1 * | 2/2003 | Sakaida et al. ................ 216/83 |
| 2003/0119281 | A1 | 6/2003 | Suzuki et al. |

FOREIGN PATENT DOCUMENTS

| | | |
|---|---|---|
| JP | 11-121466 | 4/1999 |

* cited by examiner

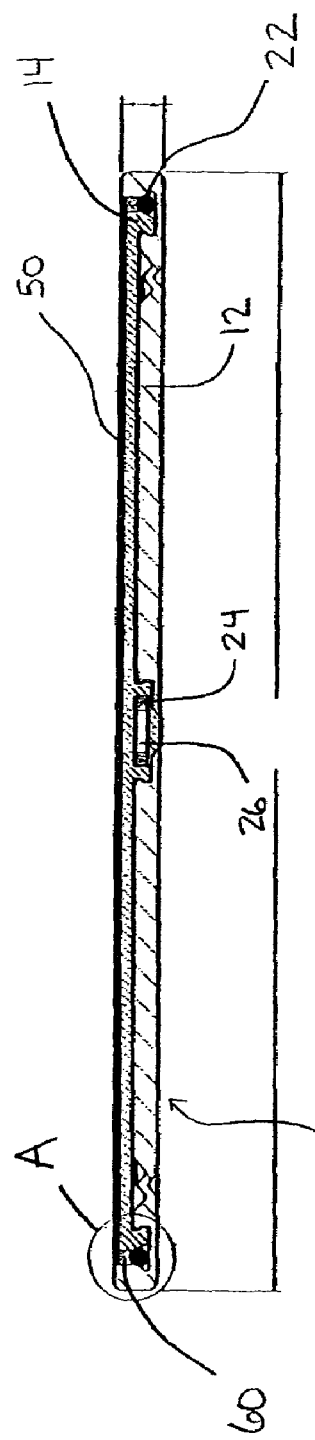
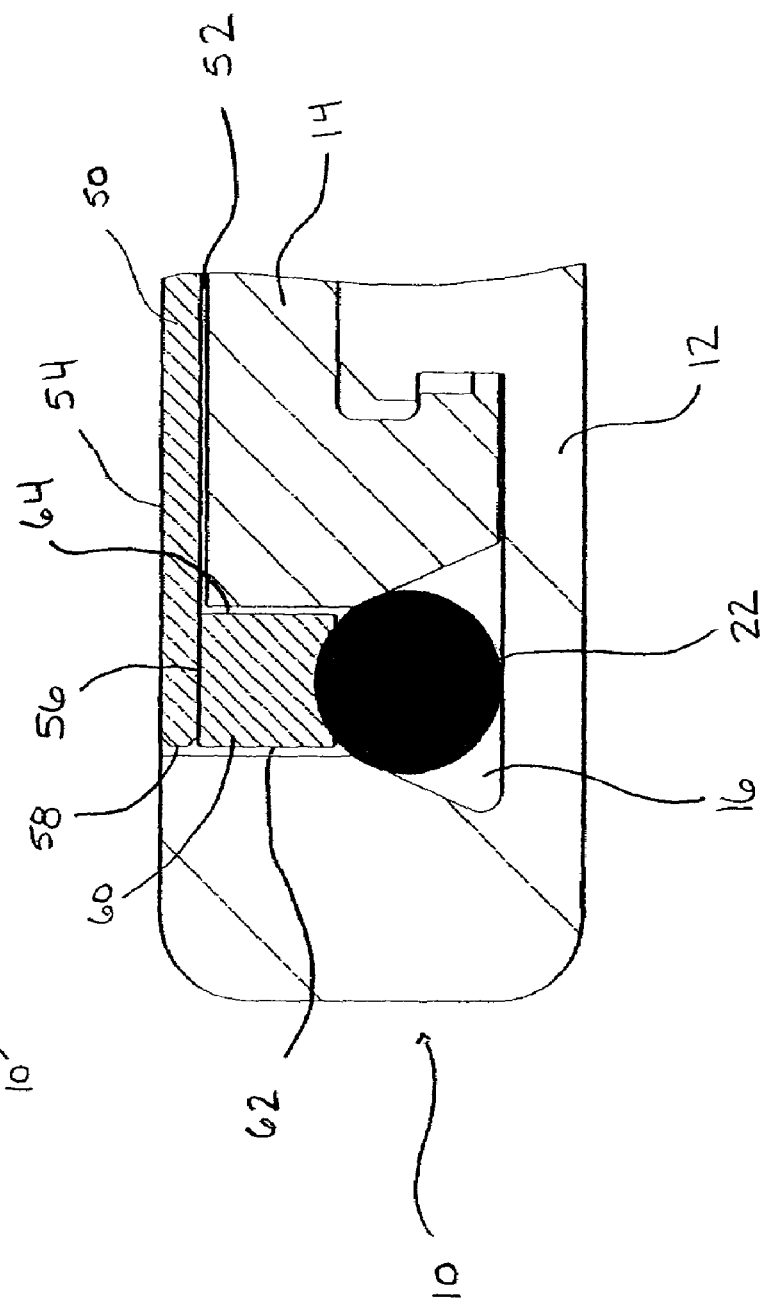

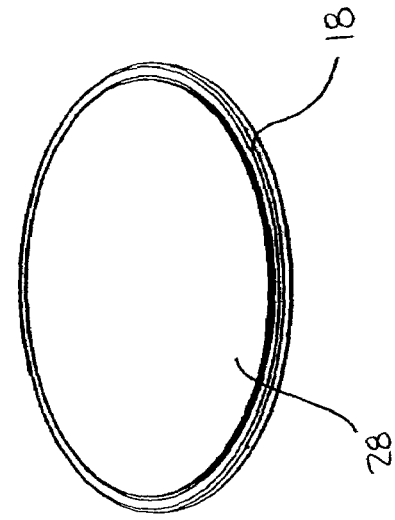
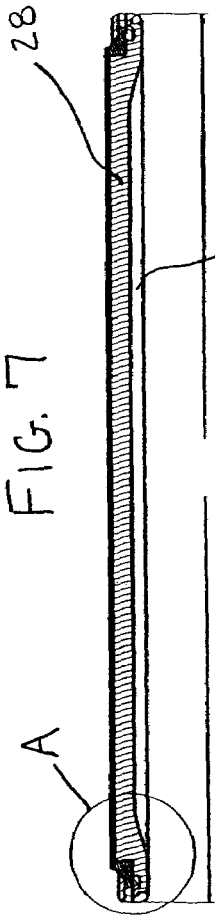
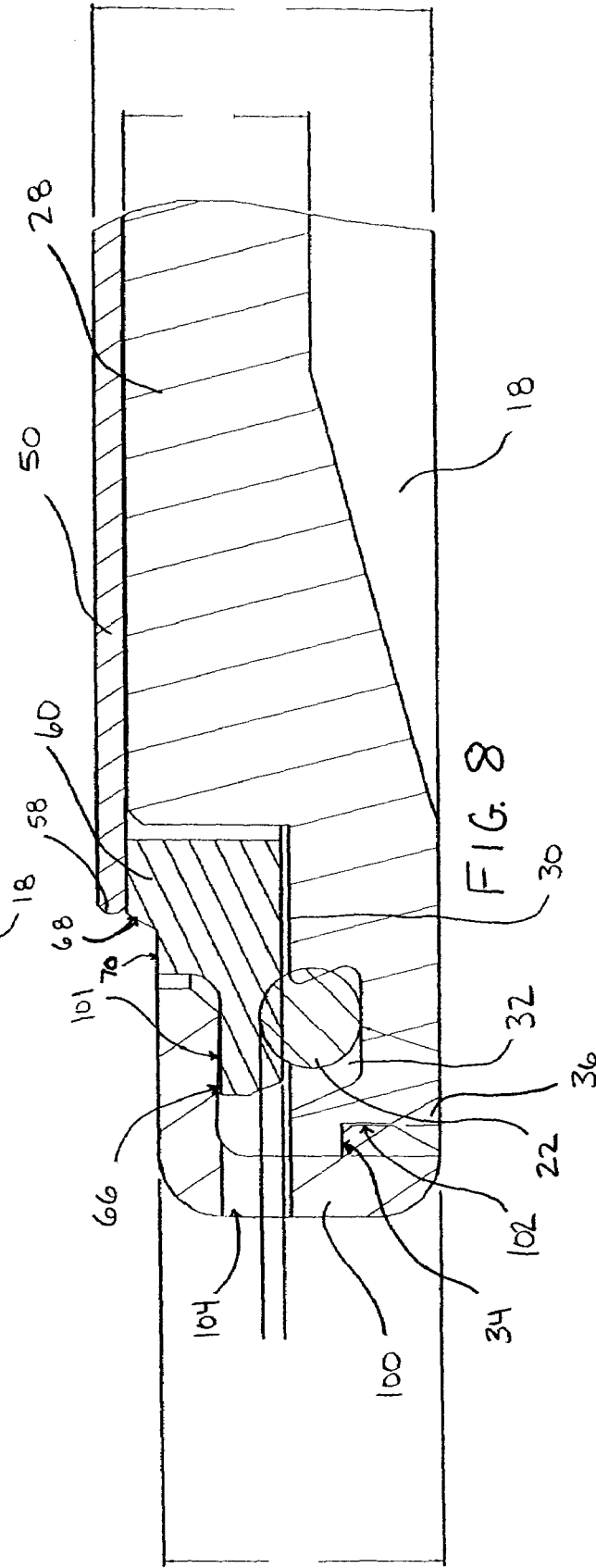

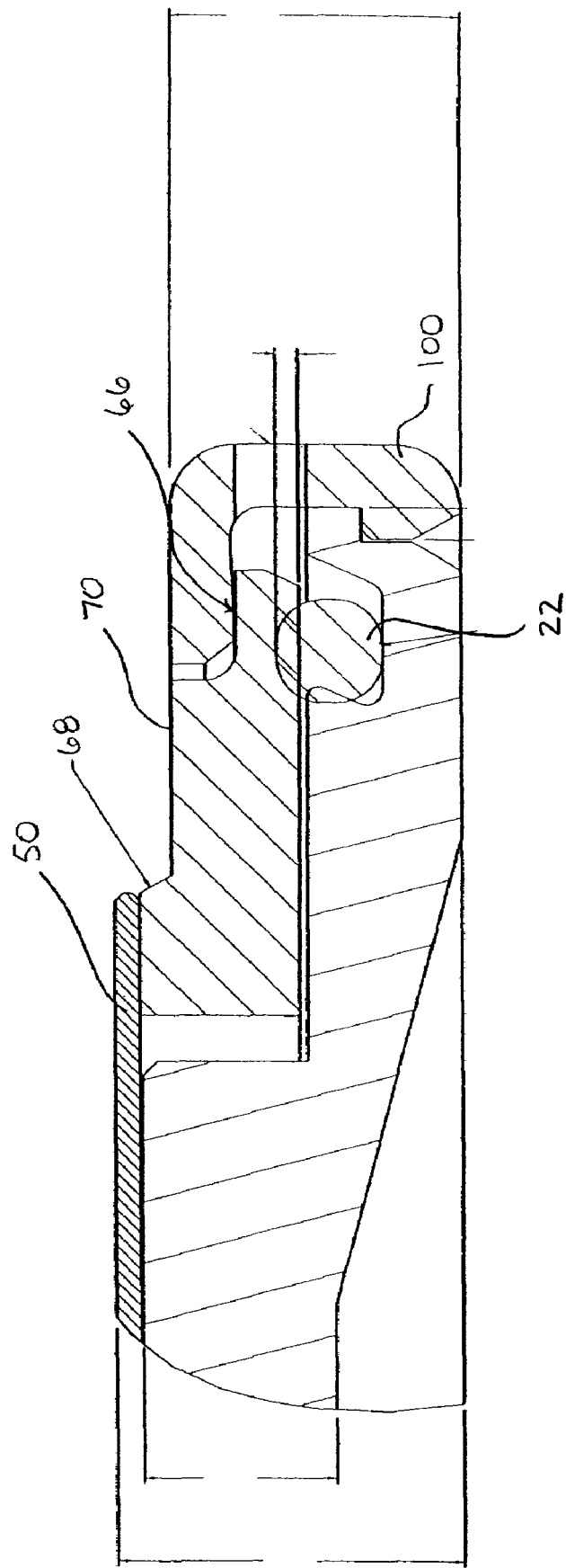

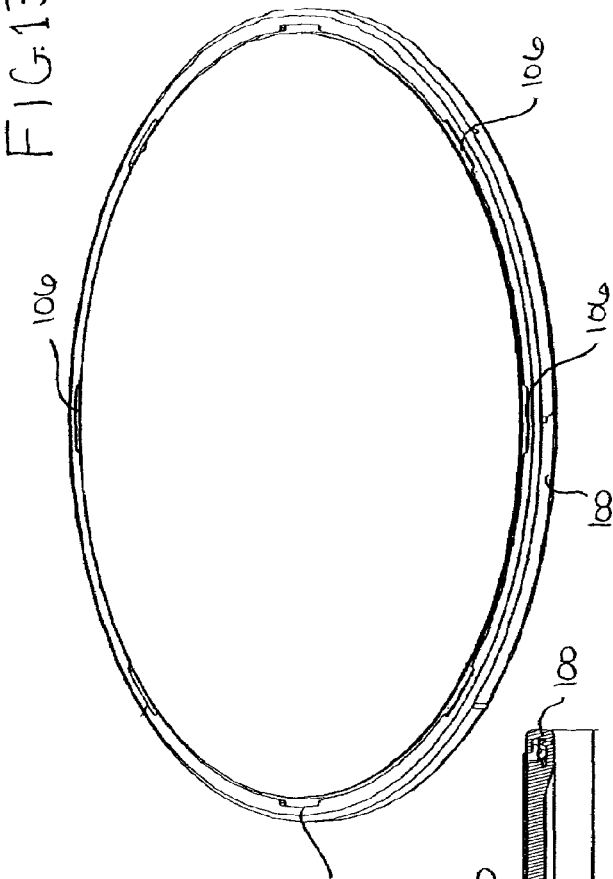
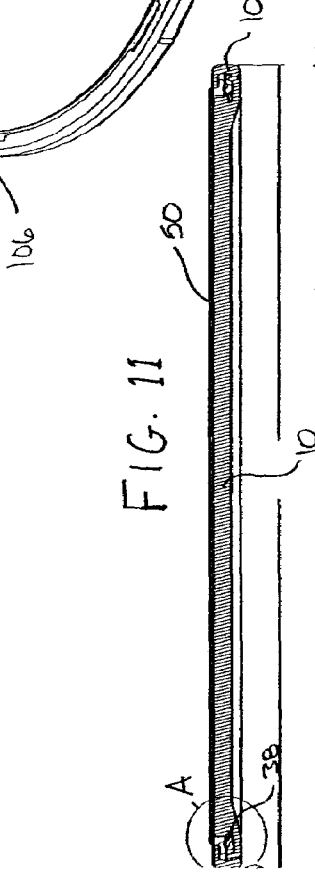
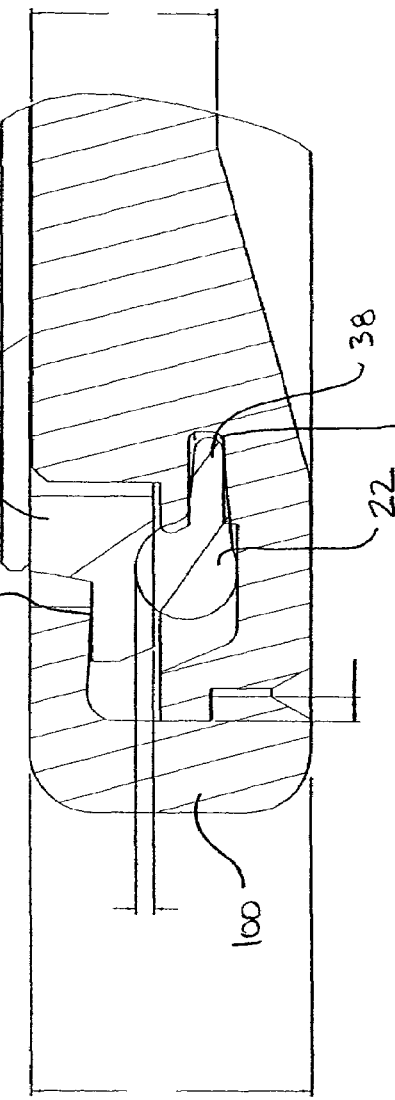

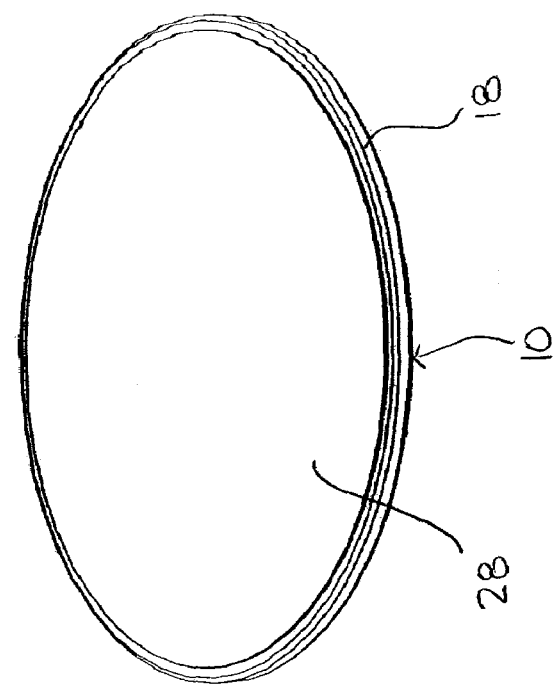
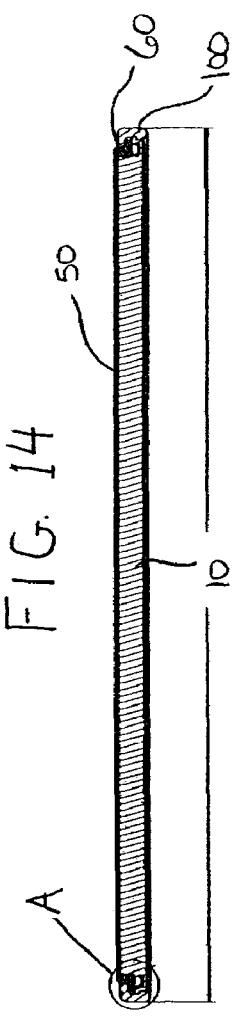
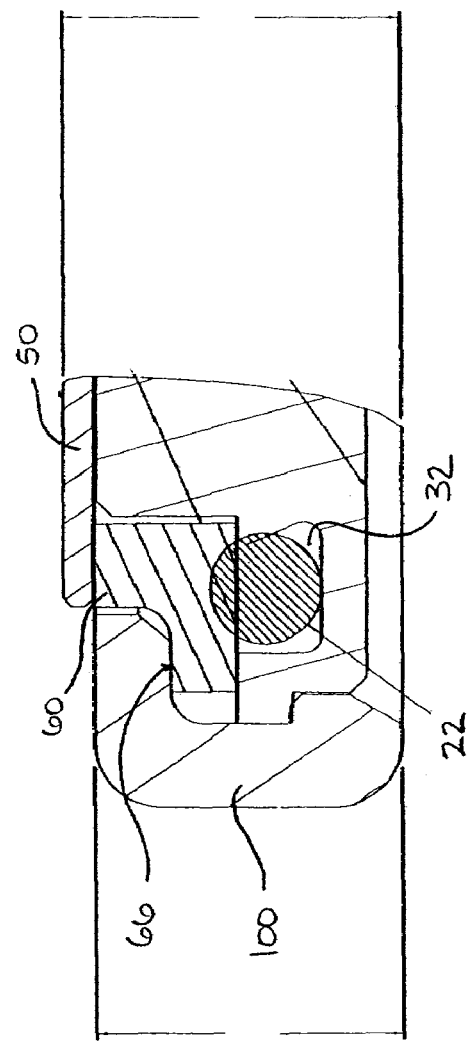

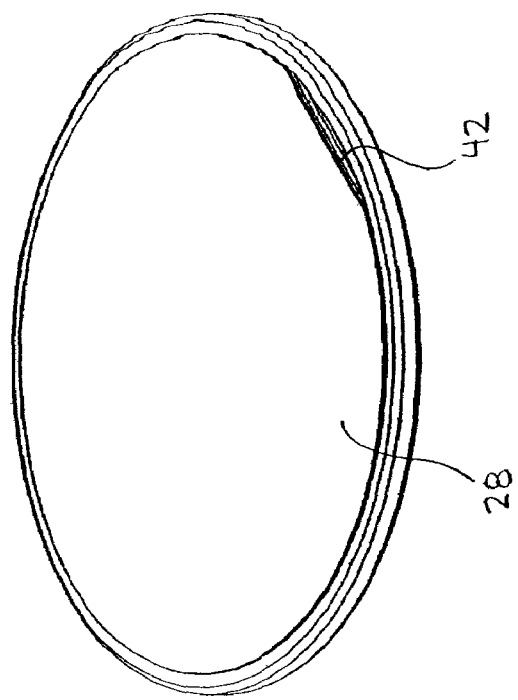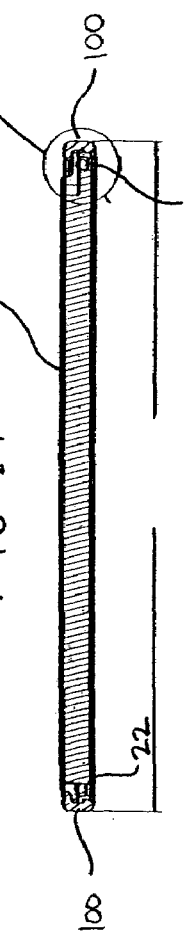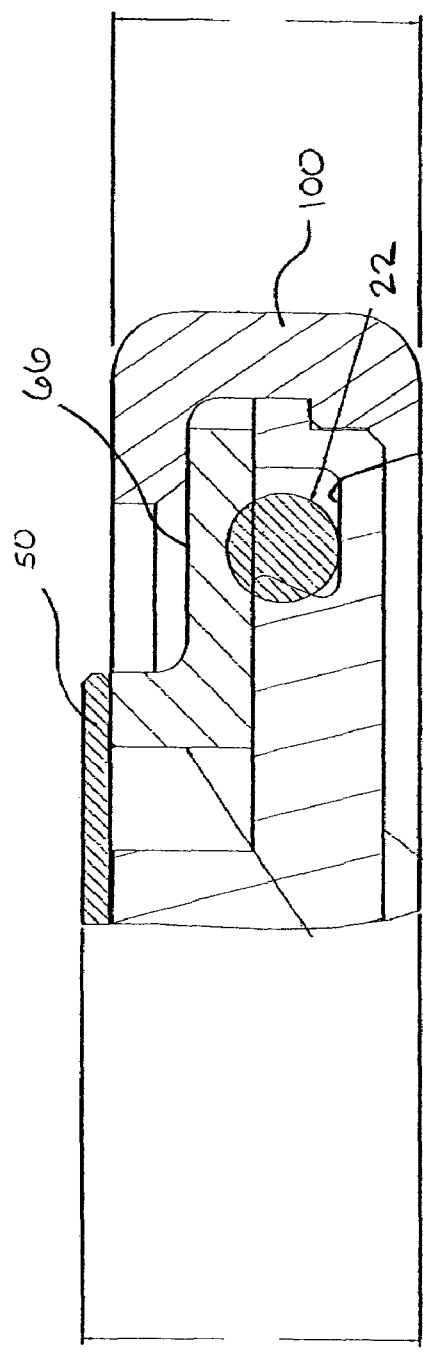

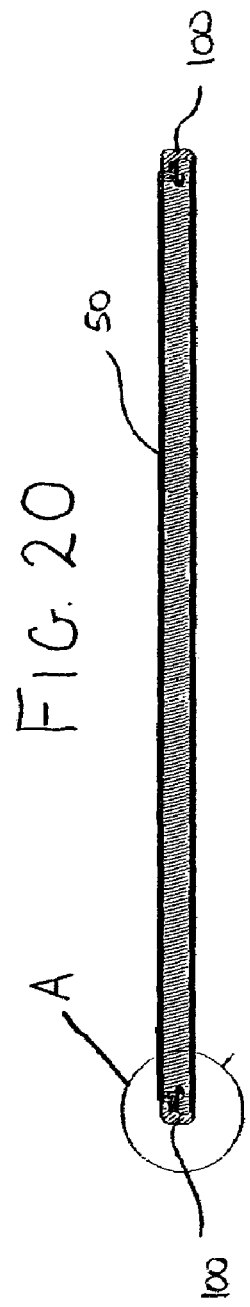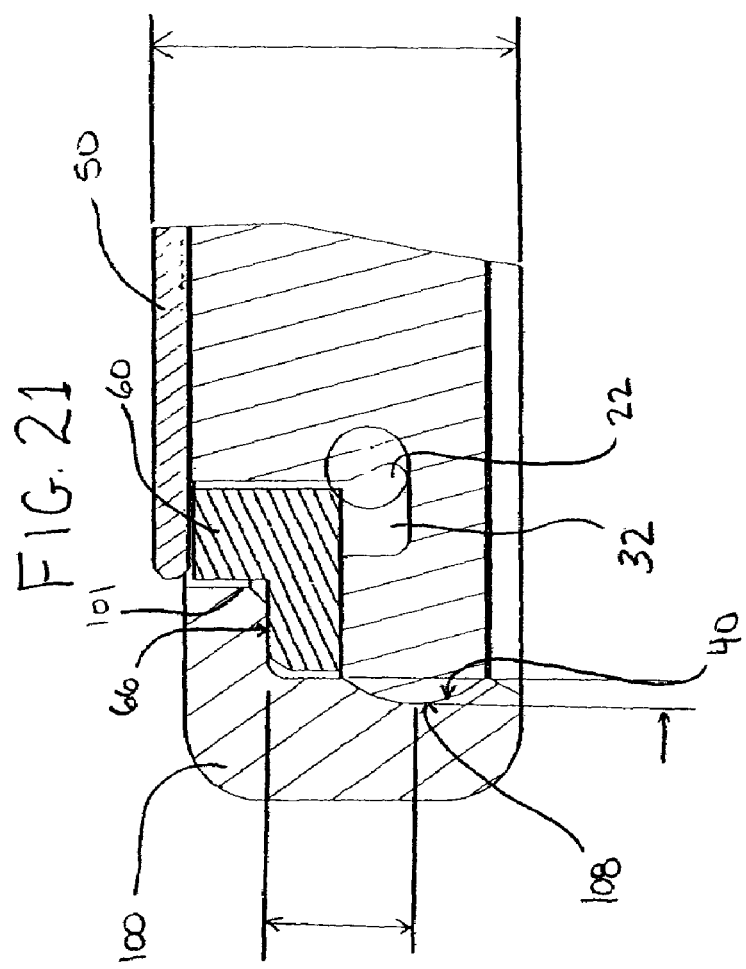

PROCESS AND APPARATUS FOR THINNING A SEMICONDUCTOR WORKPIECE

CROSS-REFERENCE TO RELATED APPLICATIONS

This Application is a Division of U.S. patent application Ser. No. 10/923,131 filed Aug. 20, 2004, now pending. Priority to this Application is claimed under 35 U.S.C. § 121. The above-identified Application is also incorporated herein by reference.

TECHNICAL FIELD

The invention relates to a process and apparatus for use with workpieces, such as semiconductor wafers, flat panel displays, rigid disk or optical media, thin film heads or other workpieces formed from a substrate on which microelectronic circuits, data storage elements or layers, or micromechanical elements may be formed. These and similar articles are collectively referred to herein as a "wafer" or "workpiece." Specifically, the present invention relates to a process and apparatus for use in thinning semiconductor workpieces.

BACKGROUND OF THE INVENTION

State of the art electronics (e.g., cellular phones, personal digital assistants, and smart cards) demand thinner integrated circuit devices ("ICD"). In addition, advanced packaging of semiconductor devices (e.g., stacked dies or "flip-chips") provide dimensional packaging constraints which require an ultra-thin die. Moreover, as operating speeds of ICDs continue to increase heat dissipation becomes increasingly important. This is in large part due to the fact that ICDs operated at extremely high speeds tend to generate large amounts of heat. That heat must be removed from the ICD to prevent device failure due to heat stress and to prevent degradation of the frequency response due to a decrease in carrier mobility. One way to enhance thermal transfer away from the ICD, thereby mitigating any deleterious temperature effects, is by thinning the semiconductor wafer from which the ICD is fabricated. Other reasons for thinning the semiconductor wafer include: optimization of signal transmission characteristics; formation of via holes in the die; and minimization of the effects of thermal coefficient of expansion between an individual semiconductor device and a package.

Semiconductor wafer thinning techniques have been developed in response to this ever increasing demand for smaller, higher performance ICDs. Typically, semiconductor devices are thinned while the devices are in wafer form. Conventional wafer thicknesses vary depending on the size of the wafer. For example, the thickness of a 150 mm diameter silicon semiconductor wafer is typically about 650 microns, while wafers having a diameter of 200 or 300 mm are generally about 725 microns thick. Mechanical grinding of the back side of a semiconductor is one standard method of thinning wafers. Such thinning is referred to as "back grinding." Generally, the back grinding process employs methods to protect the front side or device side of the semiconductor wafer. Conventional methods of protection of the device side include the application of a protective tape or a photoresist layer to the device side of the wafer. The back side of the wafer is then ground until the wafer reaches a desired thickness.

However, conventional back grinding processes have drawbacks. Mechanical grinding induces stress in the surface and edge of the wafer, including micro-cracks and edge chipping. This induced wafer stress can lead to performance degradation and wafer breakage resulting in low yield. In addition, there is a limit to how much a semiconductor wafer can be thinned using a back grinding process. For example, semiconductor wafers having a conventional thickness (as mentioned above) can generally be thinned to a range of approximately 250-150 microns.

Accordingly, it is common to apply a wet chemical etch process to a semiconductor wafer after it has been thinned by back grinding. This process is commonly referred to as stress relief etching, chemical thinning, chemical etching, or chemical polishing. The aforementioned process relieves the induced stress in the wafer, removes grind marks from the back side of the wafer and results in a relatively uniform wafer thickness. Additionally, chemical etching after back grinding thins the semiconductor wafer beyond conventional back grinding capabilities. For example, utilizing a wet chemical etch process after back grinding allows standard 200 and 300 mm semiconductor wafers to be thinned to 100 microns or less. Wet chemical etching typically includes exposing the back side of the wafer to an oxidizing/reducing agent (e.g., $HF$, $HNO_3$, $H_3PO_4$, $H_2SO_4$) or alternatively to a caustic solution (e.g., $KOH$, $NaOH$, $H_2O_2$). Examples of wet chemical etching processes may be found in co-pending U.S. patent application Ser. No. 10/631,376, assigned to the assignee of the present invention. The teachings of U.S. patent application Ser. No. 10/631,376 are incorporated by reference.

Although methods for thinning semiconductor wafers are known, they are not without limitations. For example, mounting a semiconductor wafer to a submount or "chuck" (as it is commonly known) so that the wafer can be thinned requires expensive coating and bonding equipment and materials, increased processing time, and the potential for introducing contaminates into the process area. Additionally, adhesives for bonding a wafer to a chuck that may be useful in a mechanical grinding process will not withstand the chemical process fluids used in wet chemical etching. Furthermore, the current use of a photoresist or adhesive tape fails to provide mechanical support for very thin wafers either during the back grind process or in subsequent handling and processing. The use of tape also creates obstacles in the removal process. For example, tape removal may subject a wafer to unwanted bending stresses. In the case of a photoresist, the material is washed off the device side of a wafer with a solvent, adding to the processing time and use of chemicals, and increasing the risk of contamination. The use of taping and protective polymers are also costly, since both equipment and materials are necessary to apply and remove the protective media.

Further, thinned semiconductor wafers are prone to warping and bowing. And because thinned semiconductor wafers can be extremely brittle, they are also prone to breakage when handled during further processing. Thinned semiconductor wafers (e.g., below 250 microns) also present complications in automated wafer handling because, in general, existing handling equipment has been designed to accommodate standard wafer thicknesses (e.g., 650 microns for 150 mm wafer and 725 microns for 200 and 300 mm wafers).

Accordingly there is a need for a process and equipment for producing thinner semiconductor workpieces. At the same time, there in a need to provide thinner workpieces that are strong enough to be handled by conventional equipment to minimize the threat of breakage. Finally, it would be advantageous to develop a system that reduces the number of processing steps for thinning a semiconductor workpiece.

SUMMARY OF THE INVENTION

The present invention provides a method and apparatus for use in processing wafers. The new system and apparatus allows for the production of thinner wafers that at the same time remain strong. As a result, the wafers produced by the present process are less susceptible to breaking. The unique system also offers an improved workpiece structure for handling thinned wafers and reduces the number of processing steps. This results in, among other things, improved yields and improved process efficiency.

In one aspect, the present invention provides a chuck for receiving and supporting a workpiece having a device side and a back side. The device side of the workpiece includes a rim disposed on a peripheral portion thereof. The chuck includes a body for supporting the workpiece that has a groove or aperture formed in a surface of the body for receiving the rim of the workpiece. The chuck also includes a compressible member disposed in the groove for forming a seal between the body and the rim of polymeric material. A vacuum seal is created between the workpiece and the chuck body, securing the workpiece to the chuck for processing.

In another aspect, the present invention provides a chuck for receiving and supporting a workpiece having a rim disposed on a peripheral portion thereof. The chuck includes a body for supporting the workpiece and a retainer removeably attached to the body that is adapted to snap over and surround a portion of the rim securing the workpiece to the body. The chuck further includes a compressible member that forms a seal between the body and the rim. The chucks disclosed by the present invention can be used to process semiconductor workpieces that are strong, can be handled by conventional automated handling equipment and have thicknesses of less than 125 microns.

Several processes for thinning a semiconductor workpiece are also provided. The process includes the steps of placing the semiconductor workpiece having a rim onto a chuck body so that a back side of the workpiece is exposed. Using a mechanical retainer or a vacuum seal, the workpiece is secured to the chuck. The back side of the workpiece is then thinned to a desired thickness (preferably less than 125 microns).

These and other objects, features and advantages of this invention are evident from the following description of preferred embodiments of this invention, with reference to the accompanying drawings.

BRIEF DESCRIPTION OF THE DRAWINGS

FIG. 1 is a cross-sectional view of a chuck according to the present invention with a workpiece having a polymer rim bonded to the workpiece disposed thereon.

FIG. 2 is a partial enlarged of the chuck and workpiece assembly show in FIG. 1, demonstrating the cooperation between the chuck and the workpiece.

FIG. 7 is a cross-sectional view of yet another embodiment of a chuck according to the present invention with a workpiece having a polymer rim disposed thereon.

FIG. 8 is a partial enlarged view of the area designated A in FIG. 7 showing the cooperation between the chuck and the workpiece.

FIG. 9 is a top perspective view of the chuck shown in FIG. 7.

FIG. 10 is a partial enlarged view of a variation of the engagement seal show in FIG. 8.

FIG. 11 is a cross-sectional view of yet another embodiment of a chuck according to the present invention with a workpiece having a polymer rim disposed thereon.

FIG. 12 is a partial enlarged view of the area designated A in FIG. 11 showing the cooperation between the chuck and the workpiece.

FIG. 13 is a top perspective view of the chuck show in FIG. 11.

FIG. 14 is a cross-sectional view of yet another embodiment of a chuck according to the present invention with a workpiece having a polymer rim disposed thereon.

FIG. 15 is a partial enlarged view of the area designated A in FIG. 14 showing the cooperation between the chuck and the workpiece.

FIG. 16 is a top perspective view of the chuck shown in FIG. 14.

FIG. 17 is a cross-sectional of yet another embodiment of a chuck according to the present invention with a workpiece having a polymer rim disposed thereon.

FIG. 18 is a partial enlarged view of the area designated A in FIG. 17 showing the cooperation between the chuck and the workpiece.

FIG. 19 is a top perspective view of the chuck shown in FIG. 17.

FIG. 20 is a cross-sectional of yet another embodiment of a chuck according to the present invention with a workpiece having a polymer rim disposed thereon.

FIG. 21 is a partial enlarged view of the area designated A in FIG. 20 showing the cooperation between the chuck and the workpiece.

DETAILED DESCRIPTION

Figure 3:
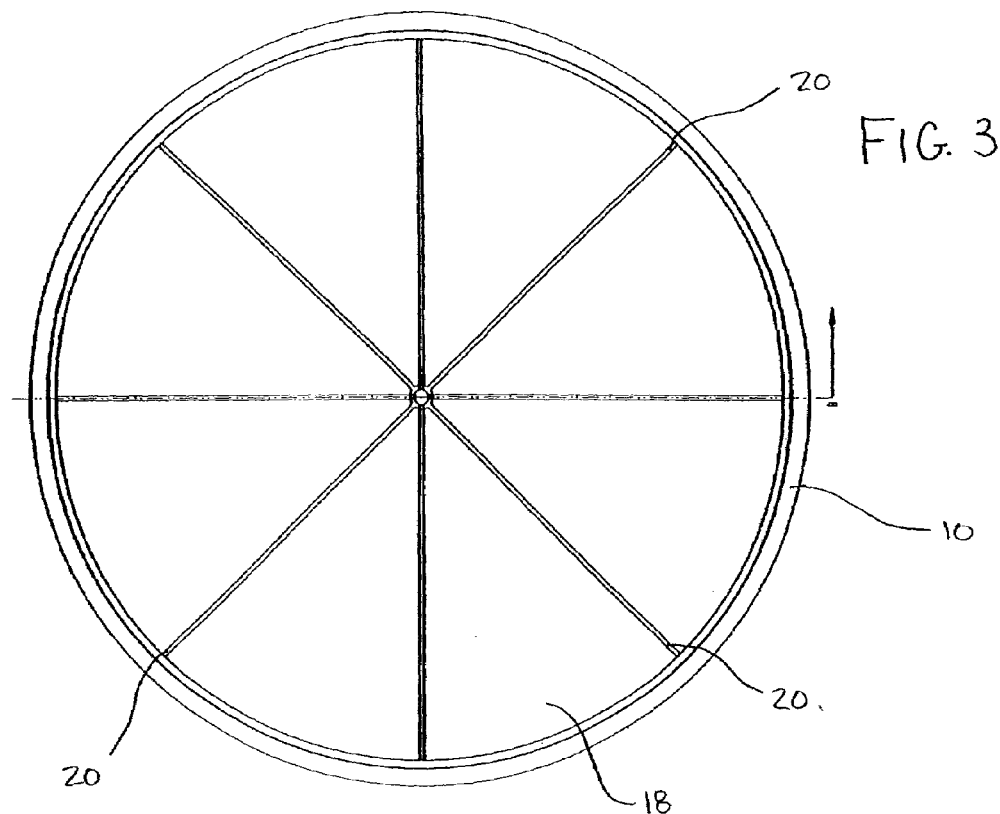
FIG. 3 is a top view of the chuck shown in FIG. 1.

With reference to FIGS. 1-6, there is shown a chuck 10 for supporting a workpiece 50 during processing in accordance with one embodiment of the present invention. In accordance with the embodiment, the chuck 10 is comprised of an outer body 12 removably engaged to an inner body 14. When engaged, the outer body 12 and inner body 14 define a groove 16 around a peripheral portion of the chuck 10. The groove 16 houses an annular gasket 22 and accepts the polymer rim 60 that is bonded to the workpiece 50. A vacuum must be applied to secure the workpiece 50 to the chuck 10.

Figure 6:
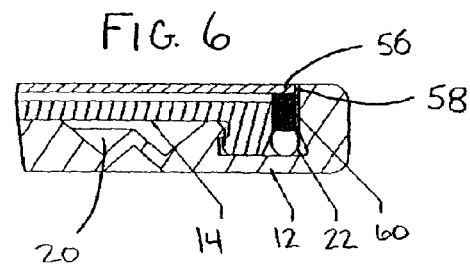
FIG. 6 is a partial enlarged view of the area designated B in FIG. 4 showing the cooperation between the chuck and the workpiece.

As best illustrated in FIG. 3, the chuck 10 of present invention has a cylindrical shape. The top of the chuck body 18 includes a series of channels 20 which communicate a vacuum to the workpiece, thus creating a seal between the workpiece and the inner body 14 of the chuck 10. The chuck 10 further comprises an annular gasket 22 formed from a compressible material to create a seal between the polymer rim 60 and the outer body 12 of the chuck 10. As illustrated in FIGS. 2 and 6, the annular gasket 22 is shaped like an "O-ring" but it is contemplated that other shapes can be used as well. The annular gasket 22 is preferably formed from a suitable elastomeric material, for example: a perfluoroelastomer sold by DuPont under the tradename Kalrez or sold by Greene, Tweed & Co. under the tradename Chemraz; fluoruelastomers sold by DuPont under the tradename Viton; and hydrocarbon elastomers sold under the tradename EPDM. The annular gasket 22 creates a flexible interface between the workpiece 50 and the chuck 10 to relieve some of the stress that is exerted on the workpiece 50 during assembly and disassembly of the chuck 10.

Figure 4:
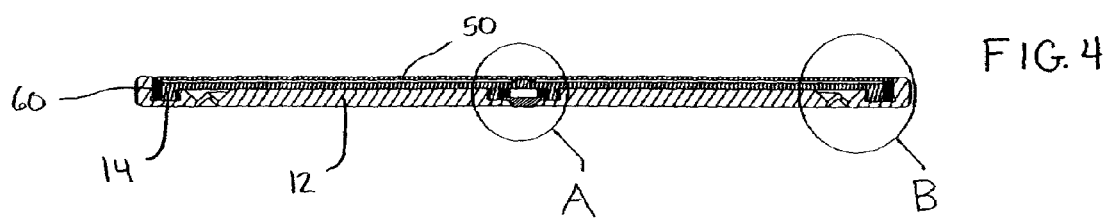
FIG. 4 is a cross-sectional view of yet another embodiment of a chuck according to the present invention with a workpiece having a polymer rim disposed thereon.
Figure 5:
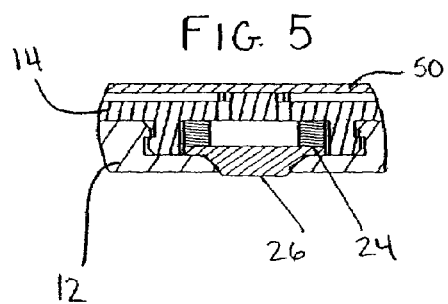
FIG. 5 is a partial enlarged view of the area designated A in FIG. 4 showing a vacuum actuator.

Referring to FIGS. 1, 4 and 5, the chuck 10 also includes a spring 24 and elastomer poppet 26 to actuate and release the vacuum source. As explained above, a vacuum is applied to create the seal formed between the workpiece 50 and the chuck 10.

The outer body 12 of the chuck 10 can be made from a number of different polymer materials. Preferably the outer body 12 comprises polytetrafluoroethylene. The inner body 14 of the chuck 10 preferably comprises a fluoropolymer such as polyvinylidene fluoride sold by Atofina Chemicals under the KYNAR tradename, or a silicon carbide, or ceramic material, which is channeled or porous to create volume for the vacuum seal between the chuck 10 and the workpiece 50. The preferred materials for fabrication are those that are both stable and highly chemically resistant.

While the chuck 10 can be used to support a variety of workpieces, it is particularly suited for use with semiconductor wafers, flat panel displays, rigid disk or optical media, thin film heads or other workpieces formed from a substrate on which microelectronic circuits, data storage elements or layers, or micro-mechanical elements may be formed. The workpiece 50 for use with the chuck 10 shown in FIGS. 1-6 is generally in the form of circular wafers, such as circular semiconductor wafers. Accordingly, the workpiece 50 has a front side 52, commonly referred to as a device side, and a back side 54 which is typically the side that is processed, by for example a back grinding or etch method. A detailed explanation of semiconductor etching processes is disclosed in U.S. Pat. No. 6,632,292, assigned to the assignee of the present invention, and incorporated herein by reference. Much like conventional wafers, the workpiece 50 of the present invention will generally have a thickness within the range of 650 to 725 microns before processing; however, a workpiece having thicknesses below 625 microns may also be used.

Unlike previous workpieces used in the art, the workpieces 50 in accordance with the invention include a polymer rim 60 bonded to either the device side 52 or the back side 54 thereof. As illustrated in FIGS. 2 and 6, the workpiece 50 has a polymer rim 60 bonded to the outer periphery 56 of the device side 54. The polymer rim 60 will be bonded to a peripheral portion of the device side of the workpiece section and preferably occupy less than 5% of the device side surface area (DSSA), more preferably less than 3% of the DSSA, or even less than 1% of the DSSA. Most preferably, the polymer rim will be bonded to the device side on an area commonly referred to in the art as the "exclusion zone".

The polymer rim 60 will generally have a thickness in a range of about 0.030-0.190 inch and most preferably around approximately 0.125 inch. The polymer rim 60 has two straight edges 62, 64 in this example. However, as will be discussed below, other shapes and configurations for the polymer rim 60 may also be used. The polymer rim 60 provides both support and strength to the workpiece 50, particularly to workpieces that have undergone a conventional backgrinding or etching process. Workpieces in accordance with the present invention after processing can have thicknesses of between 25 to 500 microns and still remain strong enough to be handled by conventional processing equipment. The thickness of the polymer rim 60 remains constant and the wafer is thinned from a pre-thinned thickness of about 650-725 microns to any desired final thickness; for example, less than 300 microns, preferably less than 150 microns, more preferably less than 125 microns, especially less than 100 microns, even less than 50 microns, or less than 25 microns.

In addition, the polymer rim 60 protects the edge 58 of the workpiece 50 from damage during processing, improves process uniformity and simplifies workpiece handling by allowing equipment to interface with the polymer rim rather than the workpiece. As seen in FIGS. 2 and 6, the polymer rim 60 interfaces with the annular gasket 22 instead of the workpiece thus reducing the probability of damage to the workpiece during processing.

The polymer rim 60 preferably comprises a thermoset polymer, e.g., an epoxy or similar material. A preferred epoxy for use in accordance with the present invention is sold by 3D Systems under the ACCURA SI-40 Nd tradename. While the polymer rim may be applied to the workpiece by a number of different methods, the preferred method utilizes an epoxy stereolithography machine. Such a process generally involves placing the workpiece into a stereolithography machine and growing the polymer rim onto the workpiece using a laser that develops the liquid epoxy into the required geometry of the polymer rim. The workpiece with the polymer rim is then thermally baked to cure the epoxy. By curing the epoxy the chemical resistance and the strength of the epoxy are enhanced.

Alternative methods of bonding the polymer rim 60 to the workpiece 50 include machining the rim from an appropriate thermoplastic polymer, such as polyvinyldienefluoride (PVDF), polyvinylchloride (PVC) or polyethylene, and then bonding the rim to the workpiece using a suitable bonding agent. A number of adhesives can be used as bonding agents to secure the polymer rim to the workpiece including: Corro-Coat FC 2100 N epoxy, Crystalbond 509 Hot Stick, Crystalbond 590 Hot Stick and 3M Jet-Melt Adhesive 3796. In the alternative, tape can be used to secure the polymer rim to the workpiece. Suitable tapes for use with the present invention include double coated tapes sold by 3M under the product numbers 3M 9495MP 5 mm double-coated, 3M 444 4 mm double-coated, 3M 9490LE 6 mm double-coated, and ultra violet tapes, for example a UV tape sold by Furukawa under product number SP-552M-130.

Turning specifically to FIGS. 7-9 an alternative embodiment of the present invention is shown. In accordance with that embodiment, the chuck 10 has a body 18 having a raised inner portion 28 for supporting the workpiece 50. The chuck 10 also includes a lower portion 30 and a groove 32 extending around the outer periphery of the chuck. The groove 32 is adapted to house the annular gasket or O-ring 22 which helps to seal the workpiece 50 to the chuck 10.

The chuck 10 also includes a retainer 100. As illustrated in FIG. 8, the retainer 100 includes two engagement members 101 and 102. The first engagement member 101 is adapted to fit over an exposed contact edge 66 of the polymer rim 60. The second engagement member 102 is adapted to fit under a ridge 34 on the lower body the chuck 10 to mechanically seal the workpiece 50 to the chuck 10. Unlike the chuck discussed above in relation to FIGS. 1-6, no vacuum is required to secure the workpiece to the chuck shown in FIGS. 7-9. Instead, a simple snap engagement retains the workpiece to the chuck. The mechanical seal offers a more robust seal between workpiece and the chuck ensuring that any processing fluid is prevented from migrating to the device side of the workpiece benefits.

The retainer 100 includes a series of rinse holes 104 for allowing any processing fluid to escape from any cavities formed between the chuck 10 and the retainer 100. Recesses 36 are provided on the lower body of the chuck 10 where the retainer 100 is secured to the body of the chuck. A tool (not shown) can be inserted into the recesses 36 so that the retainer 100 can be simply popped off the chuck 10 after processing is completed.

As illustrated in FIG. 8, the workpiece 50 has a polymer rim 60 bonded to the outer periphery 56 having an "L-shaped" configuration. The polymer rim 60 is bonded to the workpiece in the same manner as described above and is within the same range of thickness previously discussed. In this embodiment, the polymer rim 60 includes a beveled edge 68 for 3D fixturing and a flat edge 70 for ring fixturing. When the workpiece 50 is placed on the chuck 10, the polymer rim 60 acts as a primary sealing surface for connecting the workpiece 50 to the chuck 10 thereby protecting the edge 58 of the workpiece 50 from being damaged after processing. In addition, the annular gasket or O-ring 22 interfaces with only with an outer contact edge 66 of the polymer rim 60 further preventing the likelihood of damage to the workpiece during processing. FIG. 10 illustrates a modification of the workpiece 50 shown in FIGS. 7-8. At one portion of the workpiece 50, the polymer rim 60 has an extended flat edge 70. The extended flat edge 70 accommodates the flat formed in conventional 150 mm semiconductor wafers.

FIGS. 11-13 illustrate still another configuration for the chuck in which the annular gasket or O-ring 22 includes a flange 38. The flange 38 is adapted to be inserted into an aperture 40 provided in the body of the chuck 10. This helps secure the annular gasket 22 within the groove 32, retaining the seal or annular gasket 22 on the chuck body. In addition, the polymer rim 60 is simplified having no flat or beveled edge as shown in FIG. 7. Instead, the polymer rim 60 has a single contact edge 66. Referring now to FIG. 13, the retainer 100 is provided with a plurality of reliefs 106 along the periphery for assisting in the removal of the retainer 100 from the body. The reliefs 106 are intended to cooperate with fixturing tabs (not shown) or a tool (not shown) to facilitate removal of the retainer 100. The configuration illustrated in FIGS. 11-13 allows for simpler rim geometry while at the same time retaining the seal or gasket to the body to ensure a robust seal.

FIGS. 14-16 illustrate several alternative configurations for the workpiece in which the polymer rim 60 is simplified having no flat or beveled edge. In addition, the retainer 100 does not include the reliefs seen in FIG. 16. While the polymer rim 60 in FIG. 15 has a relatively short outer contact edge 66, a longer edge may be provided as can be seen in FIGS. 17-18. The work piece 50 having a polymer rim 60 with a longer contact edge 66 can be used in conjunction with the chuck 10 shown in FIG. 19. The chuck 10 includes a cutaway section 42 from the raised inner portion 28 that accommodates the longer contact edge 66.

Figure 22:
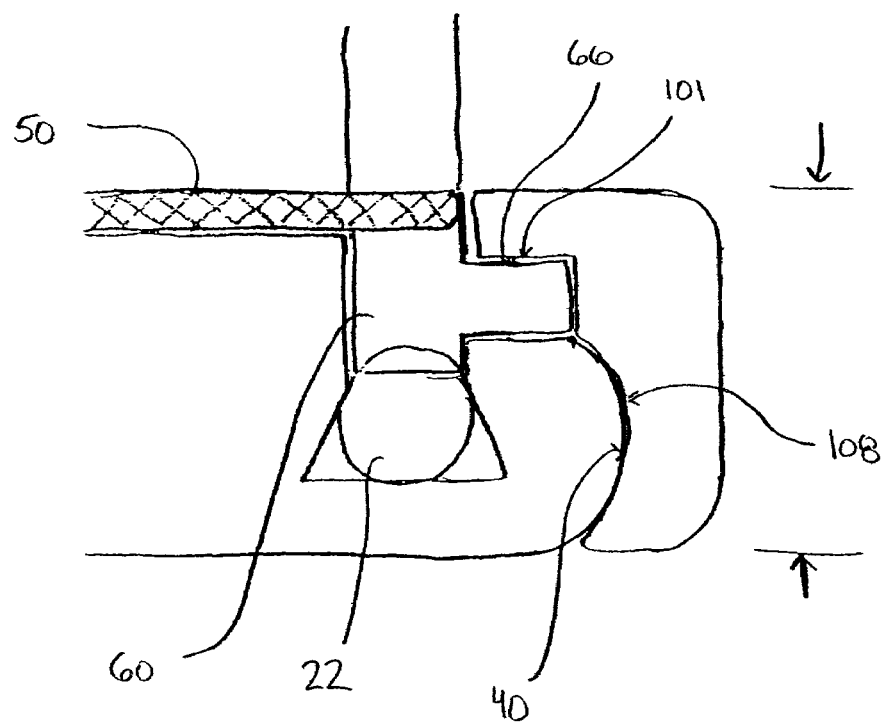
FIG. 22 is a cross-sectional view of an engagement seal between the chuck and the workpiece according to another embodiment of the present invention.

Referring now to FIGS. 20-22 additional configurations for the retainer 100 for use with the present invention are shown. In this embodiment, the retainer 100 has only one engagement member 101 that fits over the contact edge 66 of the polymer rim 60 on the workpiece 50. The retainer 100 further includes a curved edge 108 which sealingly connects to a curved surface 40 on the body of the chuck 10.

Figure 23:
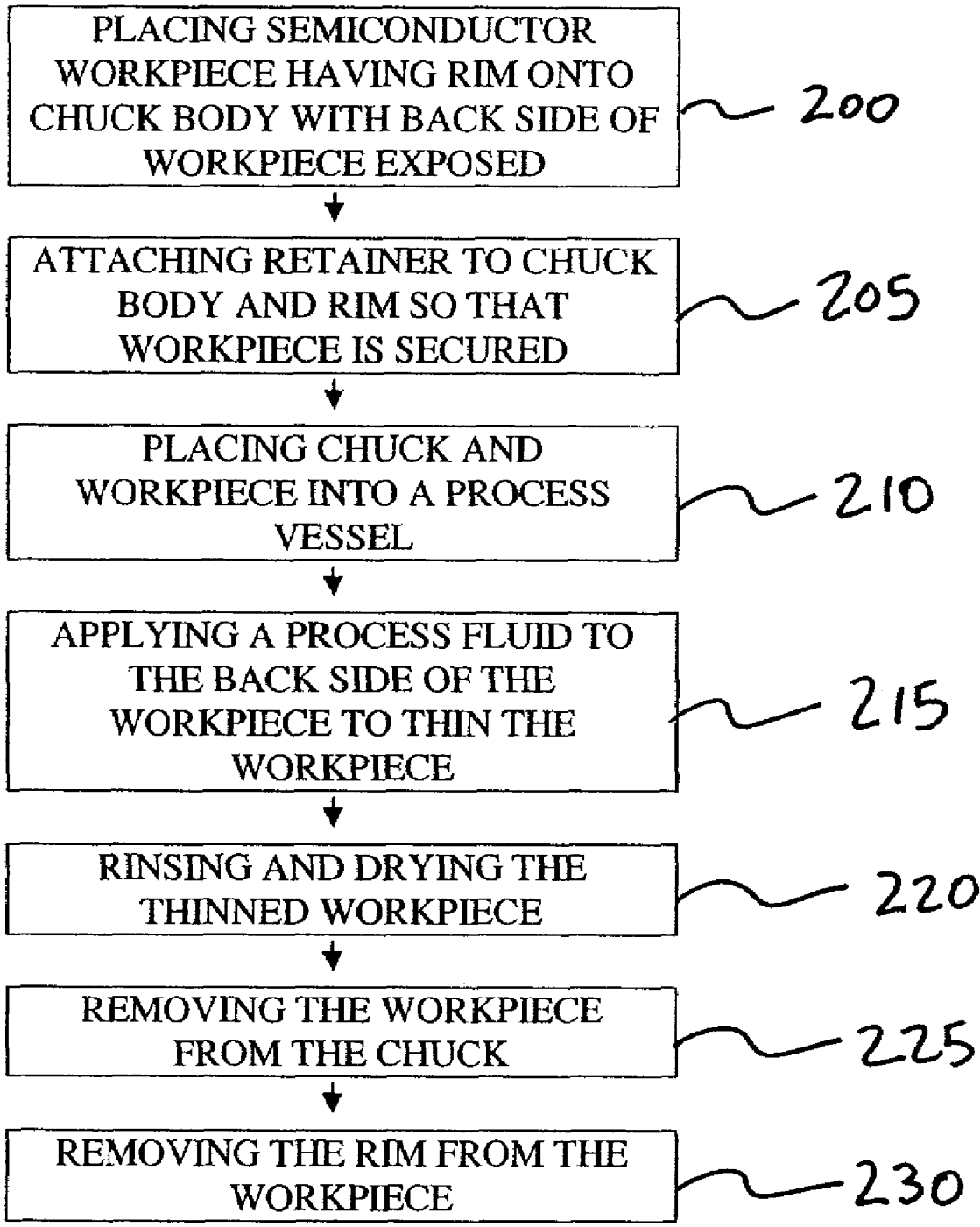
FIG. 23 is a flow diagram illustrating a process for thinning a workpiece according to one embodiment of the present invention.

Turning now to the workpiece thinning processes, FIG. 23 illustrates one embodiment of a process that may be implemented when the chuck and workpiece, having a polymer rim described above are used, for example, to thin the back side of the workpiece. At step 200, the workpiece that is to be thinned is placed onto the chuck so that the back side of the wafer is left exposed. At step 205, a retainer is attached to the chuck body and the polymer rim so that the workpiece is secured to the chuck. At step 210, the chuck and workpiece are placed into a manual or automated process chamber within a spray acid tool platform like those available from Semitool, Inc., of Kalispell, Mont.

As indicated at step 215, a process fluid is then applied to the back side of the workpiece to thin the workpiece to a desired thickness. In a preferred embodiment the final desired thickness is less than 50% of the original workpiece thickness, for example less than 300 microns, preferably less than 125 microns, more preferably less than 100 microns, especially less than 50 microns and even less than 25 microns. Preferred process fluids for use with the methods according to the present invention include deionized water, hydrogen peroxide, ozone, potassium hydroxide, sodium hydroxide, hydrofluoric acid, nitric acid, sulfuric acid, acidic acid and phosphoric acid. Although preferred process fluids for the disclosed application are discussed above, other treatment fluids may also be used. For example, a number of other acidic and basic solutions may be used, depending on the particular surface to be treated and the material that is to be removed.

At step 220, the thinned workpiece is rinsed and dried. For example, the workpiece may be sprayed with a flow of deionized water during the rinsing step and may then be subject to any one or more known drying techniques thereafter. The retainer is then disengaged from the body and the workpiece is removed from the chuck (See step 225). Finally, at step 230, the polymer rim is removed from the thinned workpiece. The polymer rim can be cut off the workpiece using a laser or the rim may be left on the workpiece and cut off as scrap during the process of dicing the workpiece into a plurality of dies.

Figure 24:
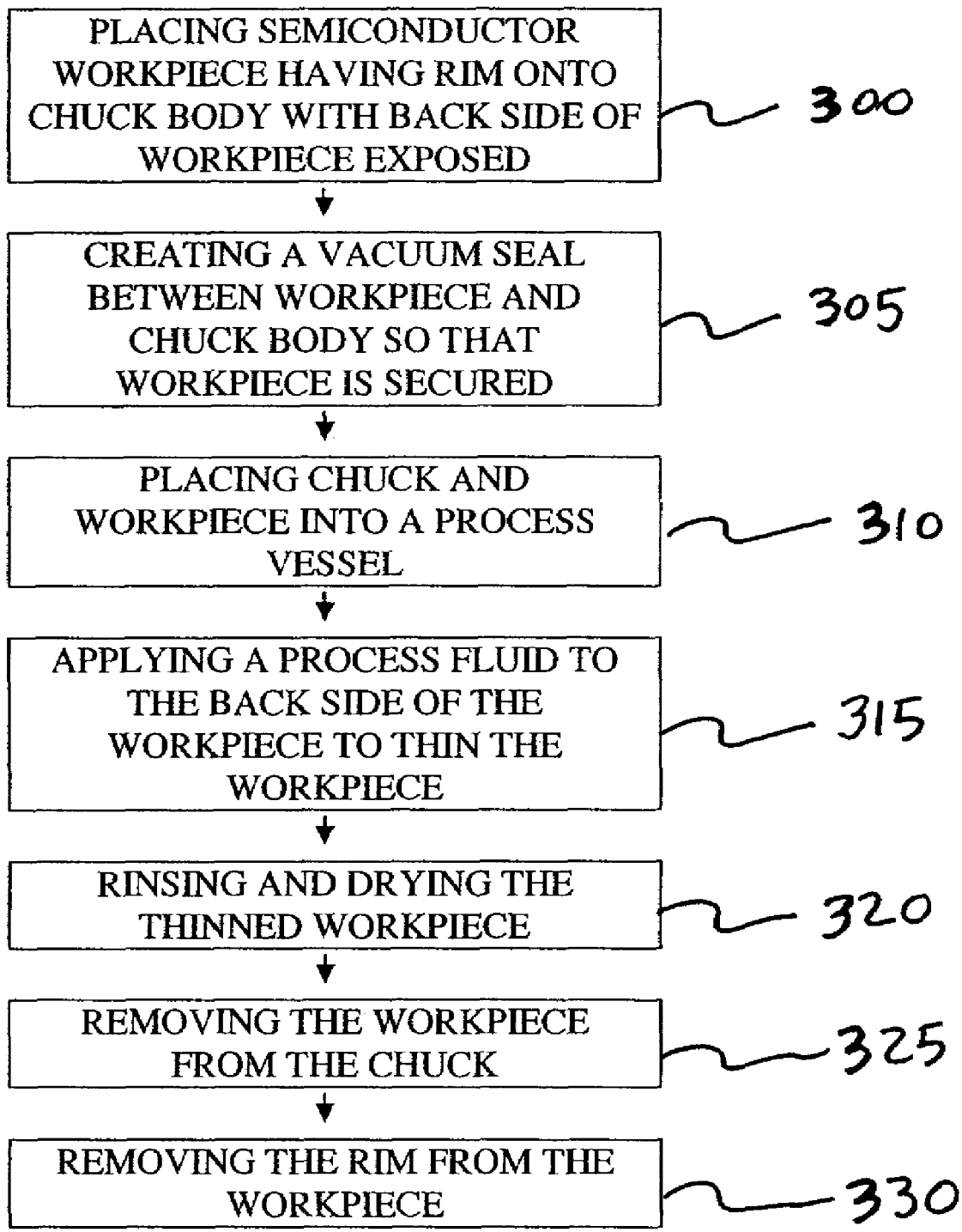
FIG. 24 is a flow diagram illustrating a process for thinning a workpiece according to another embodiment of the present invention.

FIG. 24 illustrates another embodiment of a process that may be implemented when the chuck and workpiece, having a polymer rim described above are used, for example, to thin the back side of the workpiece. At step 300, the workpiece that is to be thinned is placed onto the chuck so that the back side of the wafer is left exposed. At step 305, a vacuum seal is created between the workpiece and the chuck, securing the workpiece to the chuck. At step 310, the chuck and workpiece are placed into a manual or automated process chamber within a spray acid tool platform like those available from Semitool, Inc., of Kalispell, Mont.

As indicated at step 315, a process fluid is then applied to the back side of the workpiece to thin the workpiece to a desired thickness. In a preferred embodiment the final desired thickness is less than 300 microns, preferably less than 125 microns, more preferably less than 100 microns, especially less than 50 microns and even less than 25 microns. Preferably the workpiece is thinned at a first semiconductor etch rate, and then as the semiconductor workpiece nears the desired thickness, at a second semiconductor etch rate preferably less than the first semiconductor etch rate. The preferred process fluids for use in step 315 are the same as those identified above with respect to step 215. Although preferred process fluids for the disclosed application are disclosed, other treatment fluids may also be used. For example, a number of other acidic and basic solutions may be used, depending on the particular surface to be treated and the material that is to be removed.

At step 320, the thinned workpiece is rinsed and dried. For example, the workpiece may be sprayed with a flow of deionized water or phosphoric acid during the rinsing step and may then be subject to any one or more known drying techniques thereafter. The workpiece is then removed from the chuck (See step 325). Finally, at step 330, the polymer rim is removed from the thinned workpiece. As mentioned above, the polymer rim can be cut off the workpiece using a laser or the rim may be left on the workpiece and cut off as scrap when the workpiece is diced into a plurality of dies.

Numerous modifications may be made to the foregoing invention without departing from the basic teachings thereof. Although the present invention has been described in substantial detail with reference to one or more specific embodiments, those of skill in the art will recognize that changes may be made thereto without departing from the scope and spirit of the invention.

What is claimed is:

1. A process for thinning a back side of a semiconductor workpiece, the process comprising the steps of:
    placing the semiconductor workpiece having a rim attached to a peripheral portion of a the semiconductor workpiece onto a chuck body so that the back side of the workpiece is exposed;
    attaching a retainer to the chuck body and the rim so that the workpiece is secured to the chuck;
    thinning the back side of the workpiece so that the main body thickness is less than 300 microns; and
    removing the thinned semiconductor workpiece with the rim attached to the peripheral portion of the semiconductor workpiece from the chuck.

2. The process of claim 1, wherein the rim is comprised of a thermoset polymer.

3. The process of claim 1, wherein the rim is comprised of epoxy.

4. The process of claim 1, wherein the step of thinning the back side of the workpiece comprises chemically etching semiconductor material away.

5. The process of claim 1, wherein the main body thickness is less than 200 microns.

6. The process of claim 1, wherein the main body thickness is less than 125 microns.

7. The process of claim 1, wherein the main body thickness is less than 100 microns.

8. The process of claim 1, wherein the main body thickness is less than 50 microns.

9. The process of claim 1 further comprising the steps of rinsing and drying the thinned workpiece before removing the thinned semiconductor workpiece from the chuck.

10. The process of claim 1 further comprising the step of removing the rim from the workpiece after the thinned semiconductor workpiece is removed from the chuck.

11. The process of claim 1, wherein the step of thinning the workpiece includes immersing the chuck and workpiece into a bath of process fluid.

12. The process of claim 11, wherein the process fluid comprises a solution selected from the group consisting of HF, $HNO_3$, $H_3PO_4$, $H_2SO_4$, KOH, NaOH, and $H_2O_2$.

13. The process of claim 1, wherein the step of thinning the workpiece includes spraying a process fluid onto the back side of the workpiece.

14. The process of claim 13, wherein the process fluid comprises a solution selected from the group consisting of HF, $HNO_3$, $H_3PO_4$, $H_2SO_4$, KOH, NaOH, and $H_2O_2$.

15. A process for thinning a semiconductor workpiece having a device side and a back side, the process comprising the steps of:
    attaching a rim to a peripheral portion of the workpiece;
    placing the semiconductor workpiece onto a chuck body so that the back side of the workpiece is exposed;
    attaching a retainer to the chuck body and the rim so that the workpiece is secured to the chuck;
    thinning the workpiece to a desired thickness;
    removing the thinned workpiece having the rim attached to the peripheral portion of the workpiece from the chuck; and
    forming the workpiece into a plurality of dies.

16. The process of claim 15, wherein the step of attaching the rim to the peripheral portion of the workpiece comprises:
    applying a liquid polymer onto the workpiece using a laser.

17. The process of claim 16, further comprising the step of baking the liquid polymer to cure the polymer.

18. The process of claim 15, wherein the step of attaching the rim to the workpiece comprises:
    machining the rim from a piece of polymer material; and
    bonding the rim to the workpiece with an adhesive.

19. The process of claim 15, wherein the rim is attached to the device side of the workpiece.

20. The process of claim 15, wherein the rim is attached to the back side of the workpiece.

21. A process for thinning a semiconductor workpiece having a device side and a back side, the process comprising the steps of:
    attaching a rim to a peripheral portion of the workpiece;
    placing the semiconductor workpiece onto a chuck body so that the back side of the workpiece is exposed;
    creating a vacuum seal between the workpiece and the chuck body so that the workpiece is secured to the chuck body;
    thinning the workpiece to a desired thickness; and
    removing the workpiece with the rim attached to the peripheral portion from the chuck.

22. The process of claim 21, wherein the desired thickness is less than 300 microns.

23. The process of claim 21, wherein the desired thickness is less than 125 microns.

24. The process of claim 21, wherein the desired thickness is less than 100 microns.

25. The process of claim 21, wherein the desired thickness is less than 50 microns.

26. The process of claim 21, wherein the desired thickness is less than 25 microns.

27. The process of claim 21, wherein the step of thinning the workpiece comprises applying a process fluid to the exposed back side of the workpiece.

28. The process of claim 27, wherein the step of applying a process fluid to the exposed back side of the workpiece comprises spraying the process fluid through a nozzle onto the back side of the workpiece.

29. The process of claim 27, wherein the step of applying a process fluid to the exposed back side of the workpiece comprises immersing the back side of the workpiece into a volume of the process fluid.

30. The process of claim 27, wherein the process fluid is a solution selected from the group consisting of HF, $HNO_3$, $H_3PO_4$, $H_2SO_4$, KOH, NaOH, and $H_2O_2$.

31. The process of claim 27, wherein the process fluid has a flow rate, a concentration and a temperature and the process further comprises the step of monitoring at least one of the process fluid flow rate, concentration and temperature.

32. The process of claim 27, wherein the process fluid is applied to the workpiece at a first semiconductor etch rate and then subsequently at a second semiconductor etch rate.

33. The process of claim 32, wherein the first semiconductor etch rate is greater than the second semiconductor etch rate.

34. The process of claim 21 further comprising the step of rinsing the workpiece after it is thinned.

35. The process of claim 34, wherein the rinsing step is comprised of applying phosphoric acid to the workpiece after it is thinned.

36. The process of claim 34 further comprising the step of drying the rinsed workpiece.

37. The process of claim 21 further comprising the step of removing the rim from the workpiece.

38. The process of claim 21, wherein the rim is comprised of a polymer selected from the group consisting of epoxy, polyethylene, polyvinylchloride and polyvinyldienefluoride.

39. The process of claim 21 further comprising the step of measuring the thickness of the workpiece.

* * * * *